United States Patent [19]

Eggers et al.

[11] Patent Number: 5,692,058
[45] Date of Patent: Nov. 25, 1997

[54] DUAL AUDIO PROGRAM SYSTEM

[76] Inventors: Philip E. Eggers, 5366 Reserve Dr., Dublin, Ohio 43017; Gerald J. Sanders, 1000 Northlake Shore Dr., Apt. 1008, Chicago, Ill. 60611

[21] Appl. No.: 398,951

[22] Filed: Mar. 2, 1995

[51] Int. Cl.$^6$ ........................................ H03G 3/00
[52] U.S. Cl. .................... 381/107; 381/123; 455/133; 455/185.1; 455/186.1
[58] Field of Search .................... 381/107, 103, 381/123, 77; 455/132, 133, 185.1, 186.1

[56] References Cited

U.S. PATENT DOCUMENTS

| | | | |
|---|---|---|---|
| 3,806,820 | 4/1974 | Uchiyama | 381/123 |
| 3,876,953 | 4/1975 | Abel | 329/103 |
| 4,190,803 | 2/1980 | Imamura | 325/455 |
| 4,660,192 | 4/1987 | Pomatto, Sr. | 370/11 |
| 4,947,440 | 8/1990 | Bateman et al. | 381/107 |
| 5,027,689 | 7/1991 | Fujimori | 84/622 |
| 5,161,198 | 11/1992 | Noble | 381/123 |
| 5,386,478 | 1/1995 | Plunkett | 381/103 |

*Primary Examiner*—Forester W. Isen
*Attorney, Agent, or Firm*—Fish & Neave; Nicola A. Pisano; Michael J. DeHaemer

[57] ABSTRACT

Dual program audio apparatus is provided having two or more sources of input audio program signals, switching circuitry for selecting two of the input audio signals for amplification, one or more amplifiers for amplifying the selected input audio program signals, and one or more audio speakers for enabling a listener to hear both audio programs simultaneously. Volume control circuitry is provided for selecting a higher volume level for a foreground program and a relatively lower volume for a background program and circuitry is provided for selectively interchanging the foreground and background programs either instantaneously or gradually and continuously.

6 Claims, 4 Drawing Sheets

DUAL AUDIO PROGRAM SYSTEM

The present invention relates to a system that provides dual audio programs simultaneously to a single listener, the audio programs having different preselected volumes which may be selectively interchanged.

BACKGROUND OF THE INVENTION

In today's information age, the typical person is deluged with information from multiple media sources, and rarely has time to focus exclusively on any one source of information. It is therefore common for individuals to, for example, read a newspaper while listening to a radio program as background music at the same time. In such a case, the reader will typically only focus on the radio program when it is of special interest to him or her.

Likewise, many individuals like to listen to radio news broadcasts only for certain segments of the program, for example, the weather forecast or a particular stock price. If the listener also desires to listen to some other program before and after the segment of interest, he or she typically has to change the tuning of the radio before or after the desired news segment. Also, for example, if the listener is not aware of the precise time when the news segment of interest is to be broadcasted, he or she may miss it entirely, i.e., it may be broadcasted before the tuning is changed.

Apparatus for providing multiple audio channels from which a single listener may select one program is known, for example, from U.S. Pat. No. 3,876,953 to Abel, which describes, in a classroom setting, apparatus enabling a student to select an audio program appropriate for their skill level.

U.S. Pat. No. 4,660,192 to Pomatto describes a simultaneous AM and FM transmitter/receiver that allows simultaneous broadcasting on both AM and FM channels with the same RF carrier, thereby providing two separate channels of information (one AM and one FM). Like the Abel patent, however, the Pomatto apparatus provides for selection and amplification of only one of the channels at any one time.

U.S. Pat. No. 4,190,803 to Imamura describes a multifrequency receiver that alternately provides either a priority channel or a nonpriority channel. The Imamura apparatus includes a switching system that inhibits broadcast of the nonpriority channel when the priority channel is operative. Like the devices described in the foregoing patents, Imamura provides only one channel of programming at any one time.

In view of the desirability of broadcasting dual audio programs simultaneously to a single listener, and the absence of such features in previously known audio apparatus, it would therefore be desirable to provide audio apparatus that would allow tuning to two different audio channels so that the two programs could be broadcast simultaneously to a listener.

It would further be desirable to provide dual audio program apparatus having volume control circuitry that allows a first, foreground, audio program to be played at a higher volume and a second, background, audio program to be played at a lower volume.

It would be still further desirable to provide dual audio program apparatus that enables the content of a foreground audio program and of a background audio program to be selected according to a listeners' preferences.

It would be yet further desirable to provide dual audio program apparatus that enables a foreground program and a background program to be selectively interchanged, either instantaneously or in a gradual and continuous manner.

It would be even further desirable to provide dual audio program apparatus that enabled either or both of the audio programs to be selectively muted.

SUMMARY OF THE INVENTION

In view of the foregoing, it is an object of the present invention is to provide a dual channel audio system that provides two simultaneous audio programs.

It is another object of the present invention to provide dual program audio apparatus including volume control circuity for selectively adjusting the volume levels for foreground and background programming channels It is a further object of the present invention to provide dual program audio apparatus that enables individual selection of the content of the respective audio channels, for example, so that channel A may be an FM radio station, an AM radio station, compact disk or cassette disk, while channel B may be another radio station on the same of different band or a compact disk or cassette player.

It is a yet further object of the present invention to provide dual audio program apparatus having switching circuitry for selectively interchanging the foreground and background programs with one another, either instantaneously or gradually, that is, so that the foreground program volume may be reduced while the background program is increased to the foreground.

These and other objects of the present invention are accomplished by providing apparatus having two or more sources of input audio program signals, means for amplifying two of the input audio program signals, and means for supplying the amplifier audio program signals to speakers that enable a listener to hear both audio programs simultaneously. The present invention further includes volume control circuitry for selecting a higher volume level for a foreground program and a relatively lower volume for a background program. Switching circuitry is also provided for selectively interchanging the foreground and background programs.

The above and other objects and advantages of the invention will be apparent upon consideration of the following detailed description, taken in conjunction with the accompanying drawings.

DETAILED DESCRIPTION OF THE PREFERRED EMBODIMENT

Figure 1:
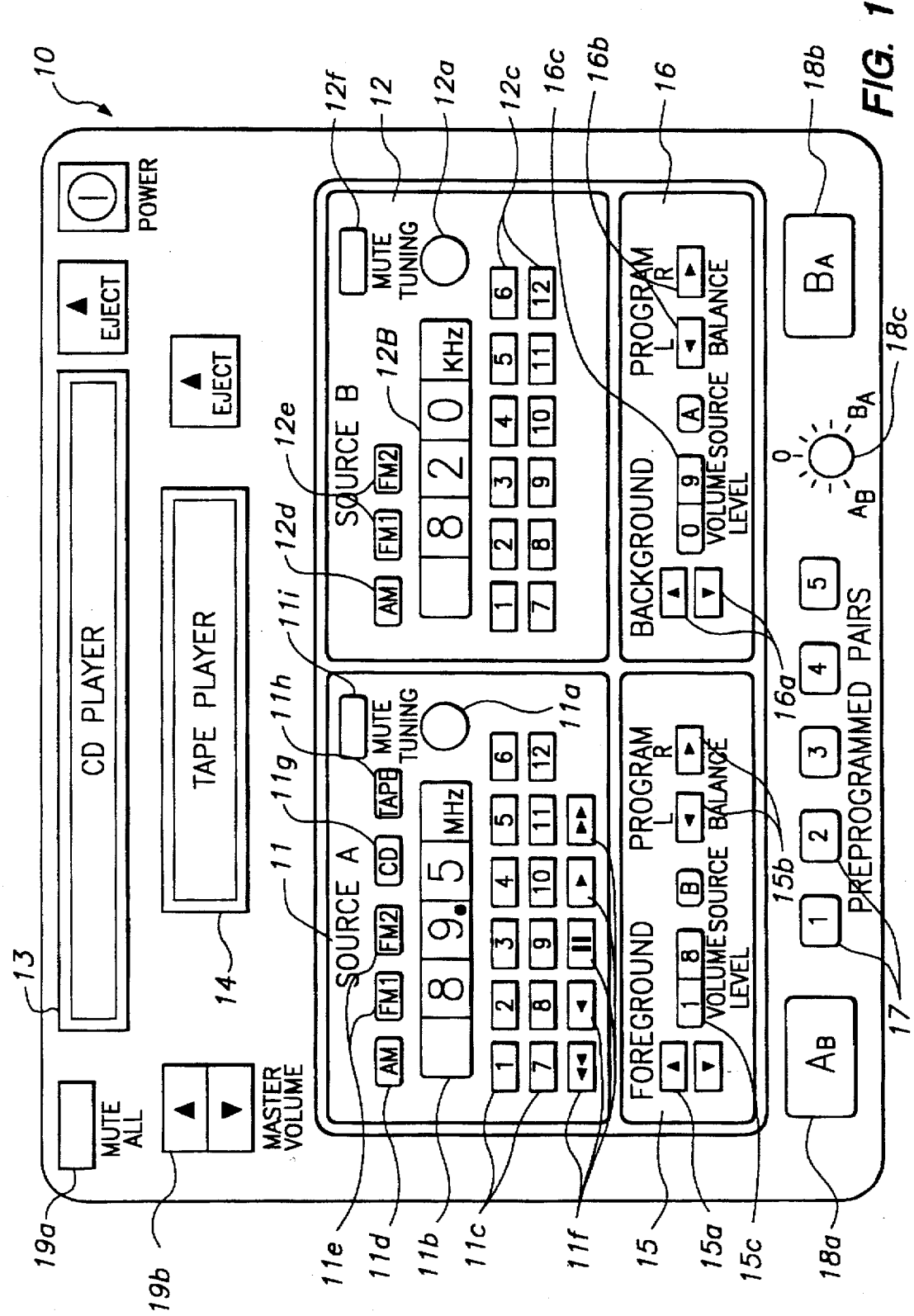
FIG. 1 is an elevation view of the front panel of an illustrative embodiment of dual program audio apparatus constructed in accordance with the present invention.

The present invention finds broad applicability to audio program apparatus encountered during daily living in today's information age. One of ordinary skill in the art of audio system design will immediately recognize the applicability of the dual program capability of the present invention to, for example, in automobile sound systems, and to picture-in-picture television systems, as described herein below.

For simplicity of explanation, the present invention is first described with respect to illustrative embodiments employing radio broadcast input audio program signals, although those embodiments should no wise be considered as limiting applicability of the present invention. In the following description, while reference is made to certain radio bands, e.g., AM, FM, television, police and citizen's bands, the present invention finds applicability in the use of a radio receiver to receive any broadcast program, regardless of the frequency band.

By way of overview, the present invention enables a listener to tune to two different radio channels such as a news channel and a classical music channel. The listener initially selects the desired volume levels for the foreground source and the background source, thus determining (initially) which channel is in the foreground and which channel is in the background. For example, the classical music channel may be initially selected for the foreground with the news channel in the background (i.e., the classical music channel may be set to a higher relative volume level than the news channel), thus enabling the listener to listen primarily to classical music while monitoring, from time to time, information being broadcast on the news channel as it is played in the background.

When the listener hears programming on the news channel that is greater interest that the classical music, the listener actuates the switching circuitry of the apparatus, in a preferred embodiment, a single button on a remote control unit, to interchange the relative volume levels so that the news channel is now in the foreground (i.e., at a relatively higher volume level) and the classical music channel is in the background (i.e., at a relatively lower volume level). In accordance with the present invention, the listener may then actuate the switching circuitry a second time to interchange the relative volumes of the two programs again if the news channel becomes of lesser interest. A rotary dial may also be provided for gradually raising the background program to the foreground while simultaneously lowering the foreground volume level to the original background program volume, or to any intermediate volume level.

In like manner, either or both of the audio program sources could be programming from a compact disk or cassette tape playback device, or AM or FM radio broadcast program. In an automotive environment, one of the audio program sources could in addition be a car telephone, so that the driver could switch the car telephone line to the background (e.g., to listen to music), while on hold.

Referring now to FIG. 1, a control panel for an illustrative audio system 10 constructed in accordance with the present invention is described. Audio system 10 comprises two separate AM/FM radio receivers controlled by panel portions 11 and 12, compact disk player 13 and cassette tape player 14. The circuitry specific to each of these components is per se known, and forms no part of the present invention.

Audio system 10 provides rotary tuning knobs 11a, 12a, and tuning displays 11b, 12b, respectively, for tuning the radio frequency selected for reception by each of the AM/FM radio receivers. When compact disk player 13 or cassette tape player 14 is active, tuning display 11b displays information pertinent to those devices, for example, disk track number, etc.

Audio system 10 allows the user to store up to 12 AM stations on each radio receiver using selector buttons 11c and 11d, 12c and 12d, and up to 24 FM stations using selector buttons 11c and 11e, 12c and 12e, circuitry and programming techniques well known to those of skill in the art. Panel 11 also includes control buttons 11f–11h for controlling operation of compact disk player 13 and cassette tape playback 14.

As will of course be appreciated, the present invention provides for maintaining a selected audio program on one channel (e.g., maintaining FM station at 89.7 MHz on Source A) while changing the selection of programming for the other channel (e.g., selecting AM station at 610 kHz, then selecting compact disk program, then selecting FM station at 90.5 MHz on Source B). Thus, for example, a listener could maintain a news broadcast program on Source A while varying the programming on Source B as suits his preference.

Preselected program pairs, e.g., 89.5 MHz on Source A and 820 kHz on Source B, may be stored using selector buttons 17, which permit convenient arrangement of the simultaneously broadcast channels and ease reconfiguring the programming combinations.

Front panel portions 15 and 16 of audio system 10 provide volume and balance controls, 15a, 16a, and 15b, 16b, respectively, for the audio programs output by source A (i.e., the radio receiver controlled by panel 11, compact disk player 13, or cassette tape player 15) and source B (the radio receiver controlled by panel 12).

Depending upon how the user programs the relative volumes on panels 15 and 16, one audio program output will be in the foreground (higher relative volume) and the other audio program output will be in the background (lower relative volume). The volume levels selected for each of the audio programs are displayed in displays 15c, 16c of panel portions 15 and 16. In particular, displays 15c and 16c may provide a digital display of audio levels ranging from the lowest volume setting of 1 to the highest volume setting of 30, and may also identify which channel (Source A or B) has been selected for the foreground and which channel has been selected for the background.

Selection of which source is in the foreground and which source is in the background is selected by depressing either $A_B$ or $B_A$ buttons 18a or 18b. The relative volumes between the foreground and background programs may be adjusted to any values between the values displayed on displays 15c, 16c, by adjusting rotary knob 18c. In its clockwise most position, the audio program from source B is in the foreground at the volume shown on display 15c, in its counterclockwise-most position, the audio program from source A is in the foreground at the volume shown on display 15c.

In addition, the volume of either source or both can be temporarily reduced to below the audible range by depressing the mute buttons 11i, 12f or 19a, for example, where the programming on one channel is of particular priority and it is desired to temporarily reduce the volume on the other channel below audible levels.

Master volume control 19b permits the volume of both sources of programming to be raised or lowered by the user as appropriate for a particular listening situation. For example, in an application of the present invention to an automotive audio system, the higher the speed of the automobile, the higher the volume that be desired by the user to overcome ambient noise (e.g., engine, air turbulence), while retaining the relative volumes of the respective audio programs.

Figure 2:
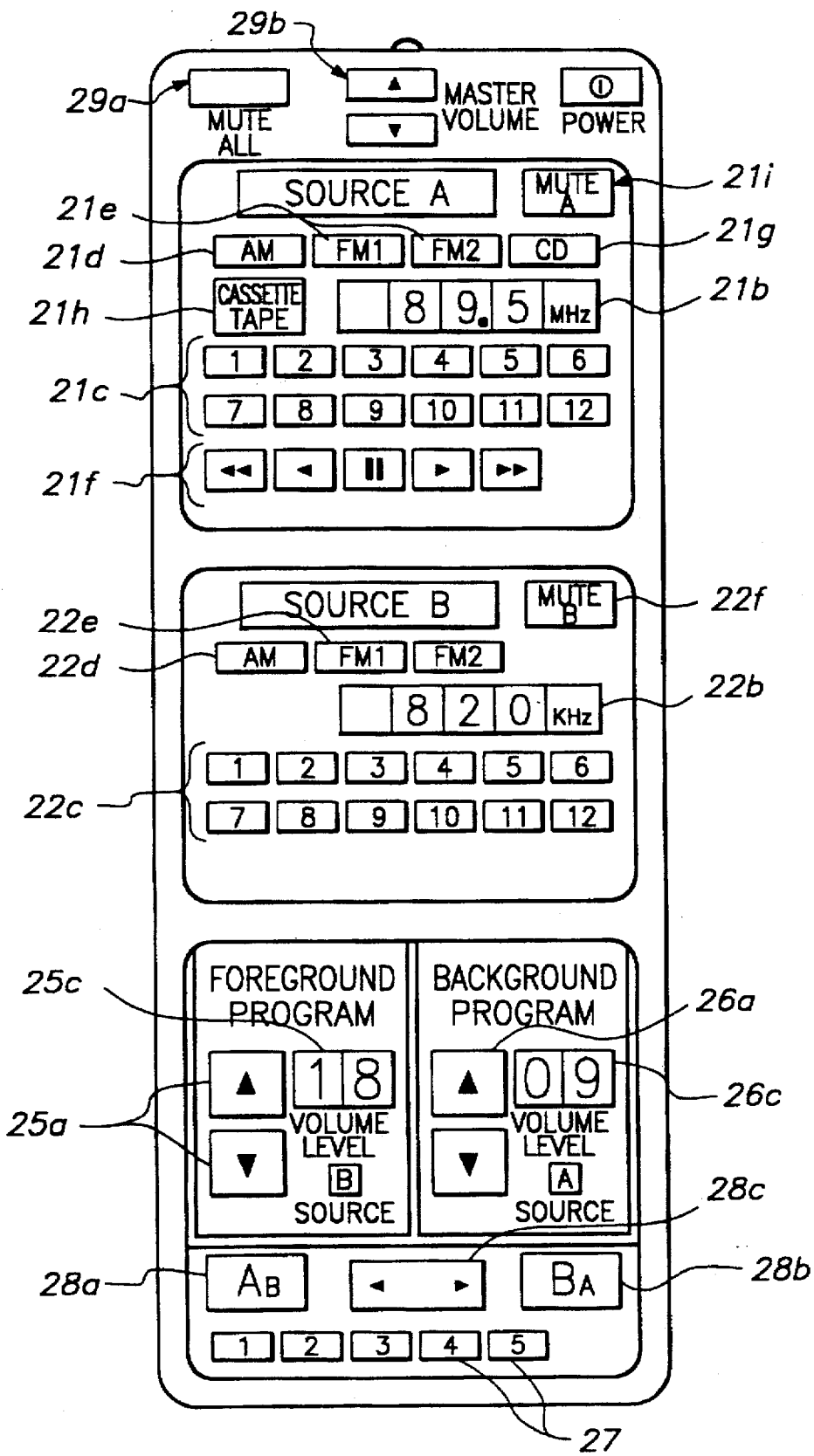
FIG. 2 is an illustrative elevation view of a remote control unit suitable for use with the dual program audio apparatus of the present invention.

Referring now to FIG. 2, hand-held remote control unit 20 suitable for use with the dual audio program system of the present invention is described. Remote control unit 20, which may incorporate infrared circuitry, a radio frequency transceiver, or be cable-connected to audio system 10, provides a hand-held key pad for remotely controlling the programming and broadcast volume levels.

Remote unit 20 may include one or more of the following features provided by the frontpanel of audio system 10 (indicated in FIG. 2 by numerals increased by ten, e.g., panel 21 in FIG. 2 corresponds to panel 11 in FIG. 1). These features may include:

(1) programming (e.g., particular AM/FM station, cassette tape player or compact disk player) for Source A, (2) programming (e.g., particular AM station) for Source B, (3) selectable storage locations for FM and AM radio stations, (4) selectable storage locations for preprogrammed pairs, (5) volume controls for foreground and background, and (6) selection switch for which channel (i.e., Source A or B) is in foreground and which channel is in background.

Figure 3:
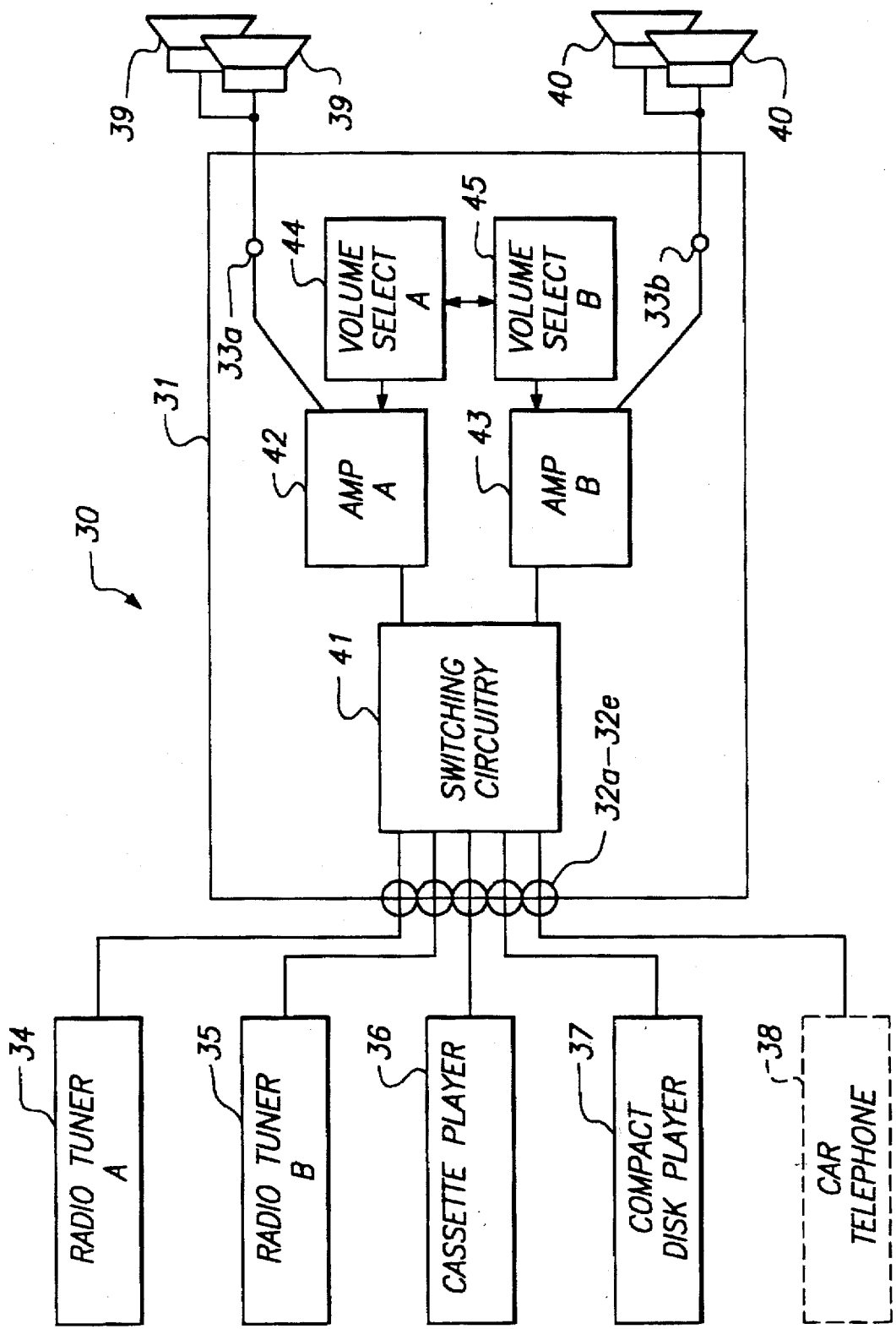
FIG. 3 is an illustrative schematic block diagram of the components of an illustrative dual program audio apparatus constructed in accordance with the present invention.

Referring now to FIG. 3, an illustrative schematic diagram for dual audio program system 30 constructed in accordance with the present invention is described. System 30 includes dual program amplifier circuitry 31 having input jacks 32a through 32e and output jacks 33a and 33b. Dual program amplifier circuitry 31 receives as its input signals at input jacks 32a–32e first and second audio programs from any of radio tuner A 34, radio tuner B 35, cassette tape player 36, compact disk player 37. In an automotive environment, car telephone 38 may also be coupled to an input jack 32e. Detailed circuities for devices 34 through 38 are well known by those of skill in the art, and form no part of the present invention.

Dual program amplifier circuitry 31 is coupled to audio speaker sets 39 and 40 via output jacks 33a and 33b, respectively, and comprises switching circuitry 41, amplifier A 42 and amplifier B 43. The volume of the audio program output by amplifier A, 43, is controlled by volume select circuitry 44, while the volume of the audio program output by amplifier B, 44, is controlled by volume select circuitry 45. Amplifiers A, 42, and amplifier B, 43, may be of conventional design, while volume control circuitries 44 and 45 may comprise suitable analog or digital components, which are per se known.

In a first embodiment, switching circuitry 41 may comprise, for example, two 5:1 audio signal multiplexers or similar elements, having their select signals input from a suitable state device, e.g., a flip-flop and associated circuitry, to maintain a current state of the system until the select buttons 18a or 18b are actuated. Each of the multiplexers has as its inputs the five audio program signals generated by devices 34 through 38, and depending upon the select signal applied to that multiplexer, passes a selected one of the audio program signals on to amplifier A or B.

For example, a first select signal may cause the audio program from radio tuner A, 34, to be passed to amplifier A, 43, while a second select signal may cause the audio program from cassette tape player 36 to be passed to amplifier B, 43. If volume select circuitry 44 is set to a higher volume setting than volume select circuitry 45, the audio program output by amplifier A will be the foreground program, while the second audio program output by amplifier B will be the background program.

Activation of the switching circuitry, for example, by depressing either $A_B$ or $B_A$ buttons 18a or 18b, will in this embodiment interchange the select signals supplied to the respective multiplexers feeding amplifiers A and B, thereby moving the foreground program to the background and vice-versa.

In an alternative embodiment of dual program amplifier circuitry 31, switching circuitry 41 may comprise a conventional cross-bar arrangement controlled by appropriate selection circuitry for selectively connecting one of devices 34–38 to amplifier A, 42, and another of devices 34–38 to amplifier B, 43.

In this alternative embodiment, volume select circuitries 44 and 45 may include 2:1 multiplexers receiving as inputs the volume level settings selected with volume control buttons 15a and 16a. A state driven select input is then supplied to each of the 2:1 multiplexers to determine which of the audio programs from amplifiers A and B is in the foreground and which in the background. Actuation of buttons 18a and 18b then interchanges the select signals controlling the input settings to the volume control circuitries 44 and 45, thereby interchanging which of the relative volume of the programs as above.

If it is desired to gradually and continuously vary the volume settings of the foreground and background programs, for example, using rotary knob 18(c), volume select circuitries may in addition, or instead, include circuitry for overriding the volume settings set with panel buttons 15a and 16a, to provide intermediate volume levels for the respective programs. In this latter case, no multiplexing would be required.

Figure 4:
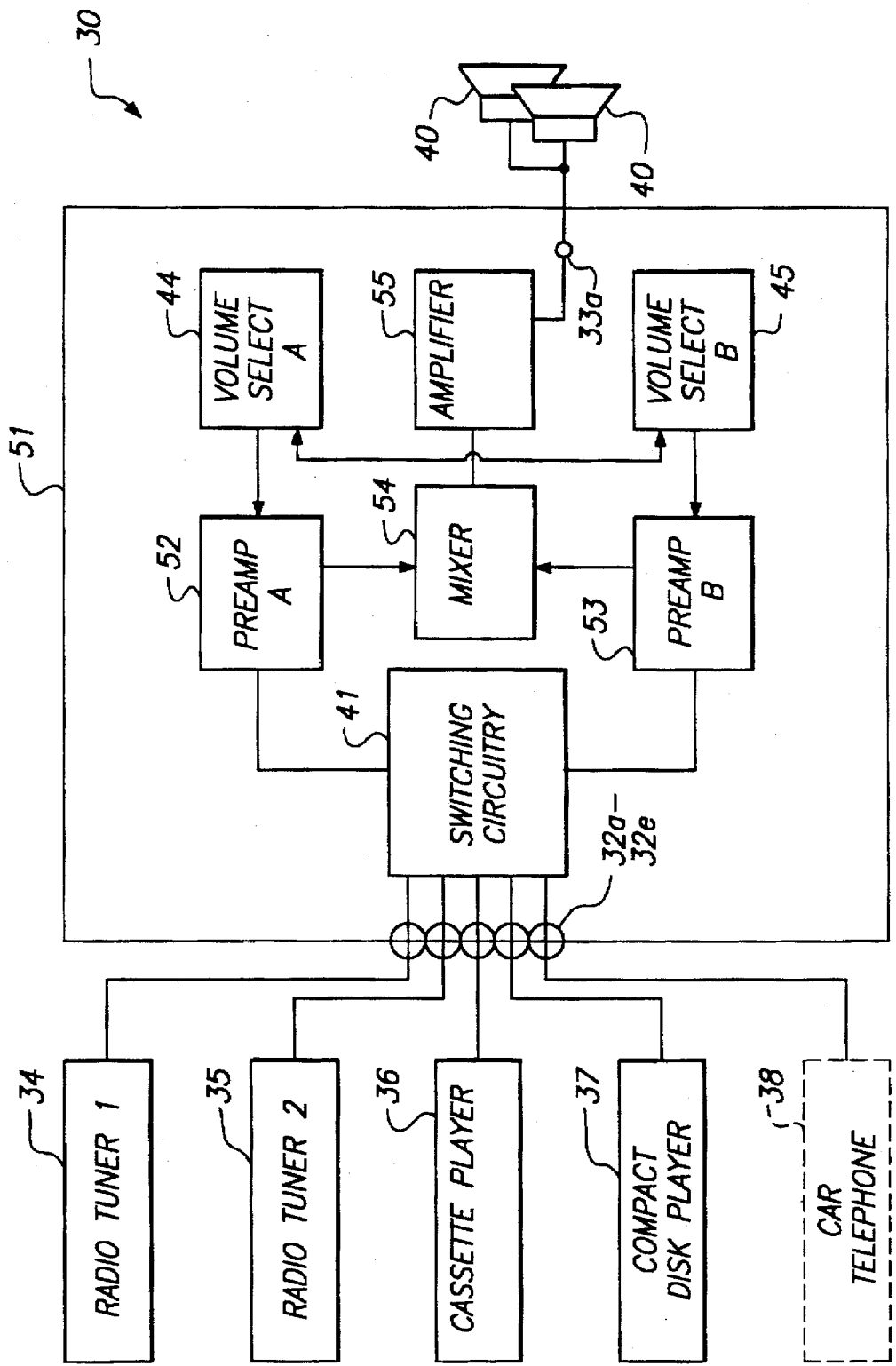
FIG. 4 is an illustrative Schematic block diagram of the components of an alternative illustrative dual program audio apparatus constructed in accordance with the present invention.

Referring to FIG. 4, yet a third alternative embodiment of the dual audio program amplifier circuitry 51 is described. Devices 34–38 and audio speakers 40 employed with this embodiment are as described above. In the present embodiment, pre-amplifier A, 52, pre-amplifier B, 53, mixer 54 and amplifier 55 replace amplifiers A and B of the previous embodiments. Pre-amplifiers 52, 53, mixer 54 and amplifier 55 are of conventional design, the specifics of which form no part of the present invention.

Switching circuitry 41, which may be of either type described hereinabove, feeds one of the audio program inputs from devices 34–38 to pre-amplifier A, 52, and a second of the audio program inputs from devices 34–38 to pre-amplifier B, 53. The output signals from pre-amplifiers A and B are controlled by volume select circuities 44 and 45, which again may be of either type described hereinabove.

The outputs of pre-amplifiers 52 and 53 are passed to audio mixer 54, which combines the signals and passes them to amplifier 55, by techniques which are per se known. The output signal generated by amplifier 55 is passed to audio speakers 40, which broadcasts the dual audio programs simultaneously. Because the relative amplification of each of the programs in the mixed signals is controlled by its respective volume select circuitry, the dual audio programs as broadcast by audio speakers retain their relative volume levels, so that the higher volume program plays in the foreground with the lower volume program in the background.

Since switching circuitry 41 and volume select circuitries 44 and 45 may be arranged as described in either of the above described embodiments. That is, switching circuitry 41 and volume select circuitries 43 and 44 of the embodiment of FIG. 4 retain the capability to interchange the foreground and background programs, either step-wise or gradually, even though they are being simultaneously broadcast by the same audio speakers 40.

As will be appreciated by those of skill in the art of audio system design, the present invention provides several desirable features that can enhance audio listening pleasure. The present invention also finds utility, for example, in the automotive field, as a way of permitting a car telephone call that has been put on hold to be monitored as a background while permitting the caller to listen to a radio broadcast as a foreground program. As another example, the background program could be selected to be a police radio band or citizen's radio band, while the foreground program may be selected as music. Again, in this case, the relative volumes of the foreground and background programs may be interchanged either step-wise or gradually and continually.

The present invention also finds utility in the field of television. In particular, television sets that provide a "picture-in-picture" capability are well known, in which a viewer can watch a first program while monitoring a second program in an inset box. Such systems, however, do not provide for broadcasting the audio program accompanying the video program being viewed in the inset box.

The present invention advances such technology by now providing a system for broadcasting the audio program for the inset box as a background audio program, while permitting the audio program accompanying the video program displayed on the main screen to be broadcast as the foreground program. In addition, the capability of the present invention to interchange the foreground and background audio programs enables the audio programs to be switched from background to foreground either independently of the main screen and inset video images, or alternatively in conjunction with switching the inset box video image to the main screen and vice-versa.

One skilled in the art will appreciate that the present invention can be practiced by other than the described embodiments, and that the present invention is limited only by the claims that follow.

What is claimed is:

1. Apparatus for simultaneously providing dual audio programs to a listener, the apparatus comprising;

circuitry for providing a plurality of audio programs, the circuitry including first and second circuits for receiving radio frequency transmissions;

storage means for storing pairs of first and second frequencies;

means for retrieving a selected one of the stored pairs of first and second frequencies and tuning the first and second circuits for receiving to the first and second frequencies, respectively;

first listener operable program selection means for selecting a first one of the plurality of audio programs as a first audio program;

second listener operable program selection means for selecting a second one of the plurality of audio programs as a second audio program;

first listener operable volume selection means for setting a first audible volume setting;

second listener operable volume selection means for setting a second audible volume setting; and means for selectively and reversibly switching between two discrete states; a first state in which the first audio program is played out at a volume determined by the first audible volume setting and the second audio program is played out at a volume determined by the second audible volume setting, and a second state in which the first audio program is played out at the volume determined by the second audible volume setting and the second audio program is played out at the volume determined by the first audible volume setting.

2. Apparatus as defined in claim 1 further comprising buttons for selectively muting the play out of the first or second audio programs.

3. Apparatus as defined in claim 1 wherein the circuitry for providing a plurality of audio programs further comprises input audio program circuitry selected from the group consisting of: a radio receiver, a car telephone, a cassette tape player or a compact disk player.

4. Apparatus as defined in claim 1 further comprising first and second amplifier means, wherein the means for selectively switching selectively couples the first audio program to the first amplifier means and the second audio program to the second amplifier means when in the first state, and couples the first audio program to the second amplifier means and the second audio program to the first amplifier means when in the second state.

5. Apparatus as defined in claim 1 further comprising first and second amplifier means for amplifying, respectively, the first and second audio programs, wherein the first volume selection means is selectively coupled to the first amplifier means and the second volume selection means is coupled to the second amplifier means, the means for selectively switching comprising circuitry for selectively interchanging interconnection of the first volume selection means from the first to the second amplifier means and interconnection of the second volume selection means from the second to the first amplifier means.

6. Apparatus as defined in claim 1 further comprising a hand-held remote control unit for activating the means for selectively switching.

\* \* \* \* \*